United States Patent [19]

Shanefield et al.

[11] 4,351,697
[45] Sep. 28, 1982

[54] PRINTED WIRING BOARDS

[75] Inventors: Daniel J. Shanefield, Princeton Township, Mercer County; Fred W. Verdi, Lawrence Township, Mercer County, both of N.J.

[73] Assignee: Western Electric Company, Inc., New York, N.Y.

[21] Appl. No.: 336,980

[22] Filed: Jan. 4, 1982

[51] Int. Cl.³ .............................................. C23F 1/02
[52] U.S. Cl. ..................... 156/643; 279/852; 134/1; 156/645; 156/656; 156/659.1; 156/901; 204/15; 204/32 R; 204/192 EC; 427/97; 427/250; 427/307; 427/328; 430/313; 430/318
[58] Field of Search ............ 156/643, 645, 656, 659.1, 156/661.1, 666, 901-902, 630; 174/68.5; 427/97, 250, 307, 327, 328; 29/829, 846, 852; 204/15, 23, 32 R, 192 EC; 430/311, 313, 314, 316, 318; 134/1, 2, 39, 41

[56] References Cited

U.S. PATENT DOCUMENTS

| | | | |
|---|---|---|---|
| 3,539,407 | 11/1970 | Frantzen | 156/630 |
| 3,984,907 | 10/1976 | Vossen et al. | 428/332 UX |
| 4,087,314 | 5/1978 | George et al. | 204/192 EC |
| 4,097,636 | 1/1978 | Hawrylo et al. | 428/209 |
| 4,135,988 | 1/1979 | Dugan et al. | 204/15 |
| 4,234,622 | 11/1980 | DuBuske et al. | 427/45.1 |
| 4,243,865 | 1/1981 | Saxena | 219/121 P |
| 4,247,579 | 1/1981 | Tuft | 156/645 X |

OTHER PUBLICATIONS

J. Vac. Sci. Technol., Vol. 11, No. 5, Sep./Oct. 1974, A Sputtering Technique for Coating the Inside Walls of Through-Holes in Substrates by J. L. Vossen, pp. 875–877.

*Primary Examiner*—William A. Powell
*Attorney, Agent, or Firm*—Joel F. Spivak

[57] ABSTRACT

A printed circuit board is made from a substrate having a copper clad layer thereon by means of first providing spaced through-holes through the substrate, mechanically scrubbing the surface of the substrate and then sputter etching the surface of the substrate so as to remove at least 50A. thereof from the surface and then vacuum metallizing the through-holes subsequent to sputter etching without breaking the vacuum and then finally forming a circuit pattern on the substrate by usual subtractive techniques.

9 Claims, 1 Drawing Figure

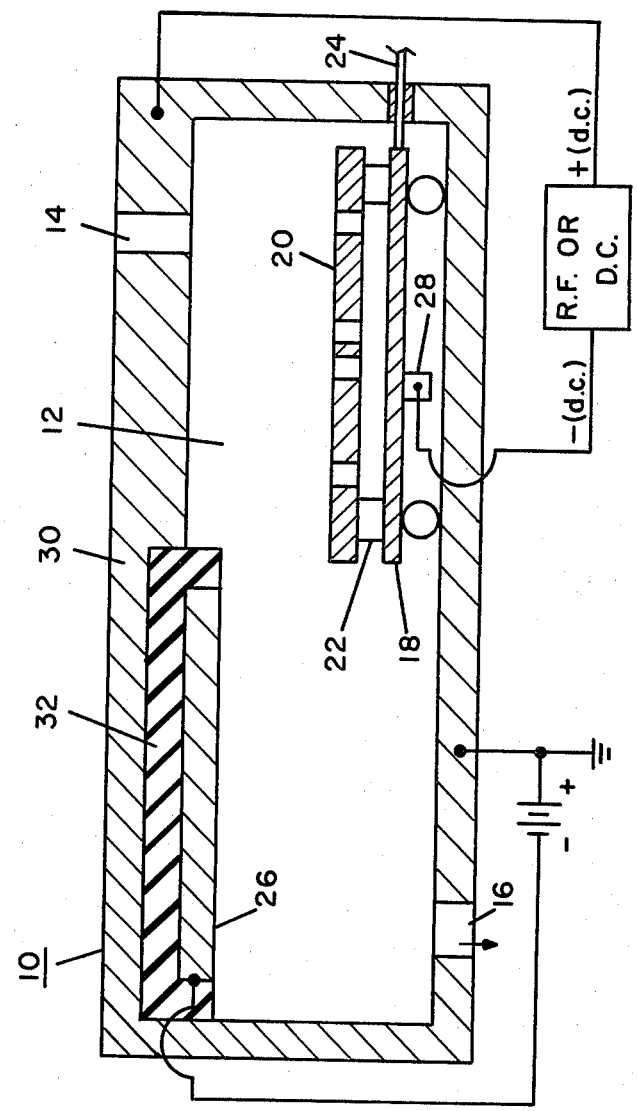

PRINTED WIRING BOARDS

TECHNICAL FIELD

This invention relates to the manufacture of printed wiring boards and, more particularly, to the vacuum metallization of through-holes in the manufacture of printed wiring boards.

BACKGROUND OF THE INVENTION

Printed wiring boards are in common use in the electronics and telecommunications and other industries for creating conductive paths on interconnector devices. These conductive paths may be formed on one or both sides of a nonconductive substrate or one side of multiple substrates laminated together. It is generally required when employing double sided or multilayered printed wiring boards that through-holes be provided so as to interconnect conductive paths and interconnect devices between sides of the printed wiring boards. It is common to use as a starting material for the printed wiring board, a substrate having a blanket metal coating formed or laminated thereover and then providing the through-holes by drilling through the substrate in predetermined areas and subsequently plating the holes formed by drilling. Currently, metallization of these through-holes is accomplished by wet chemical processing including electroless plating techniques. Since the cost of vacuum metallization has been getting lower as large scale vacuum equipment becomes more available and reliable, while the costs of the alternative chemicals involved in wet chemical processing continue to rise, it would be desirable to replace the wet chemical techniques used for through-hole plating with more economical and more environmentally desirable dry metallization techniques such as vacuum metallization. Still another reason for reducing chemical processing wherever possible is the reduction of toxic chemical waste generated in chemical processing techniques. While it is not possible to totally eliminate wet chemical tecniques when using what is known in the art as subtractive technology for forming printed circuit boards employing metal laminated panels as a starting material, at least the steps of electroless deposition can be eliminated by substituting vacuum metallization for the electroless metallization of through-holes. While the purpose of the metallization is to cover the through-holes with a conductive metal deposit, it is necessary to overlap the through-hole metallization with the metal cladding on the surface of the board. Furthermore, the vacuum deposited layer must adhere well to both the through-hole and the metal cladding to prevent delamination. In attempting to make the substitution from electroless plating to vacuum metallization, however, it was discovered that the vacuum deposited copper had insufficient adhesion to the originally laminated copper foil such that the final circuits often exhibited layer-plating or interfacial delamination failure of the bond between the vacuum metallized layer and the original laminate or between a later electroplated copper layer on the conductor paths of the circuits and the original laminated copper. Industry standards for adhesion require at least a five pound per inch peel strength with a 90° peel and preferably one seeks at least an 8 pound per inch peel strength. Until the discovery of the cause of the lack of adhesion and the removal or solution of this cause, vacuum metallization of the through-holes could not be accomplished for practical commercial use.

SUMMARY OF THE INVENTION

A method for manufacturing printed circuit boards employing a copper clad substrate having a plurality of spaced through-holes therein includes the steps of (a) mechanically scrubbing the surface of the substrate, (b) sputter etching the surface of the substrate so as to remove at least 50 A. from said surface (c) vacuum metallizing the through-holes subsequent to sputter etching without breaking the vacuum, and (d) forming a circuit pattern on the substrate.

BRIEF DESCRIPTION OF THE DRAWING

The FIGURE is an elevational schematic view of a vacuum sputtering apparatus useful in practicing the invention.

DETAILED DESCRIPTION

As previously indicated, prior attempts to vacuum metallize through-holes in copper clad printed circuit boards resulted in circuit boards which exhibited delamination due to poor adhesion between the vacuum deposited copper and the underlying copper cladding on the surface of the printed circuit board. It was initially believed that this delamination problem could be solved by simply cleaning the surface of the copper prior to vacuum metallization. Attempts were made to clean the copper surface by either mechanically scrubbing the surface, chemically cleaning the surface or sputter etching the surface prior to vacuum metallization. However, adhesion problems still persisted and delamination failure still occured. We have discovered what we believe to be the cause of the insufficient adhesion as well as a solution to the problem. It is believed that the insufficient adhesion is caused by a chromium oxide layer formed on the surface of the copper clad printed circuit boards. It is believed that a thin chromium layer is placed over bare copper clad printed circuit boards by manufacturers in order to protect the surface which oxidizes on exposure to air to form chromium oxide. We then discovered that by combining mechanical scrubbing of the surface of the substrate followed by sputter etching of the surface of the substrate so as to remove at least 50 A. of the surface, the surface is sufficiently precleaned such that a vacuum metallized layer formed after the precleaning and without exposure to air has sufficient adhesion (at least eight pounds per inch peel strength) such that circuits formed on the substrate do not later delaminate. It is hypothesized that mechanically scrubbing the surface depletes the surface of most of the chromium oxide while sputter etching reduces the remaining chromium oxide to metallic chromium which does not act to inhibit adhesion.

Based upon the aforementioned discovery, a printed circuit board may be manufactured in accordance with our invention employing commercially available copper clad substrates in accordance with the following procedures. The substrates may either have a plurality of spaced through-holes already provided therein or one may form such spaced through-holes by any known techniques. The method comprises: (a) mechanically scrubbing the surface of the substrate; (b) sputter etching the surface of the substrate so as to remove at least 50 A. from said surface; (c) vacuum metallizing the substrate surface and through-holes subsequent to sputter etching and prior to any exposure to oxygen; and (d)

forming a circuit pattern on the substrate by any of the known subtractive techniques.

It should be understood that the term "vacuum metallization" or "vacuum deposition" as used herein includes any of the known vacuum techniques for depositing a metallic layer including vacuum evaporation, sputtering, ion plating and electron beam vacuum deposition.

The general technique for forming printed circuit patterns by means of subtractive processing is very well known in the art. The technique generally involves processing the copper laminated printed circuit board having plated through-holes therein by applying a resist pattern over the copper surface so as to delineate the desired circuit pattern followed by etching of the exposed copper surface. Hence, when the resist is removed, the copper plated circuitry and the surface of the holes which are copper plated remain. Examples of the subtractive process can be found with reference to U.S. Pat. Nos. 3,673,680 and 4,135,988 both of which are incorporated herein by reference. The latter patent also teaches methods of forming apertures or through-holes through copper clad printed circuit boards.

In accordance with the present method, laminated panels of fiberglass reinforced epoxy, for example, laminated with copper foil on its surface would have holes drilled therethrough and then the surfaces would be deburred and mechanically scrubbed. The laminate would then be placed in a vacuum apparatus where the copper surface would be further treated by sputter etching so as to remove at least 50 A. from the surface thereby also reducing any oxide of chromium or other weak oxide on the surface. Without breaking the vacuum, a thin film of copper is then vacuum deposited in the through-holes as well as on the major surfaces. Photoresist, thick copper electroplating, tin alloy electroplating, photoresist stripping, etching and other steps as are well known in the art would then be carried out as usual so as to form the desired circuit pattern. In other words, except for the precleaning and vacuum metallization steps which replace the usual electroless metallization of the through-holes, standard subtractive processing is used to complete the manufacture of the circuit boards.

Typical parameters for preparing printed circuit boards in accordance with the invention are as follows:

(a) the scrubbing step may be performed utilizing a bristle brush scrubber having abrasive powder embedded in the bristles, such as a commercially available scrubber manufactured by the Chemcut Company of State College, Pa. This scrubber is used water wet. Alternatively, one may use a sanding machine such as a Somaca Company, Chicago, Ill., sander to wet sand or scrub the substrate surface. Suitable grit sizes for the abrasive powder of the bristle brush or the sander are from 180 to 400 mesh. It should be understood that other scrubbing techniques may also be suitable and that other scrubbing techniques may also be suitable and that other mesh or grit sizes can also be used as well, and that this invention is not limited by any particular scrubbing technique or mesh size of abrasive material used for scrubbing;

(b) the step of sputter etching can be carried out, for example, under RF or DC conditions. Typically, for RF sputter etching one may use a wattage of approximately 500 watts at 13 to 14 MHZ and an argon pressure of from 5 to 100 microns, approximately 10 microns being preferred. Usual etch time, in order to etch at least 50 A. from the surface, is approximately 3 minutes under these conditions. Alternatively, one may utilize a magnetron DC sputter etch employing voltages of, for example, 250 to 350 volts with powers of about 2 to 3 watts per square inch of substrate material and a vacuum of from 5 to 100 microns of argon; and (c) for copper sputter deposition, it has been found to be preferred to use argon pressures of from 0.5 to 100 microns and powers of about 45 to 100 watts per square inch of cathode.

In order to insure sputter deposited layers which can be copper plated free from through-hole voids, it has been found that the thickness of the copper deposit should be at least 4,000 A. and preferably 8,000 A. Still another discovery is that the time interval between scrubbing and etching can affect adhesion. In order to insure the required adhesion of the sputtered copper deposit, the time interval should preferably not exceed 3 days between scrubbing and etching of any printed circuit board.

EXAMPLE

A commercial printed circuit board substrate having a copper cladding laminated to at least one side thereof is drilled so as to incorporate through-holes therein in accordance with a desired circuit pattern to be provided. The board is deburred subsequent to drilling and then wet scrubbed utilizing a Chemcut Company bristle brush scrubber. The scrubbed surface is then rinsed and dried and placed in a DC magnetron sputtering apparatus 10 such as is depicted in the FIGURE. The apparatus 10 comprises a copper coated, stainless steel walled vacuum chamber 12 which is provided with a gas inlet port 14 and a vacuum port 16. Within the chamber 12 and insulated from its walls is a slidable, copper coated, stainless substrate carrier plate 18 which supports a spaced substrate 20 by means of conductive spacers 22. An insulating handle 24 extends from the carrier 18 through the chamber wall 30 in a manner so as to maintain the vacuum. The handle moves the substrate from its first position, as shown, to a second position under a copper cathode 26. During sputter etching the substrate and carrier are in the first position and act as the cathode by being negatively charged via contact 28. During sputter deposition the substrate 20 is slid into the second position under the copper cathode 26 and is itself floating electrically. The chamber wall 30 acts as the anode for both etching and deposition. An insulator 32 is provided over the copper cathode 26 adjacent the chamber wall 30. It has been found by a co-worker that more efficient sputtering into the through-holes is obtained if the substrate 20 is raised from the sputtering carrier plate 18 by by a small amount, such as about 3/16 of an inch. The sputtering apparatus 10 is evacuated by means of a vacuum pump to a vacuum of approximately $10^{-6}$ Torr and argon is bled back into the apparatus through the argon inlet 14 to a pressure of approximately $10^{-2}$ Torr. While the substrate and carrier are in the position shown, a plasma is created by applying approximately 300 volts DC across the anode 30 and substrate cathode 20. Sputter etching is continued for approximately five minutes and thence the sputtering apparatus 10 is again evacuated to approximately $5 \times 10^{-3}$ Torr and backfilled with argon to approximately 5 microns without breaking the vacuum of the apparatus 10. This prevents oxidation of any remaining chromium on the surface of the copper clad substrate 20. An 8,000 A. thick copper layer is then sputter deposited at a voltage of approximately 400 to 500 volts DC in the apparatus 10 by sliding the substrate 20 from its first position where etching takes place to its second position under the copper cathode 26. This copper deposit coats the through-hole and copper clad surfaces of the substrate. After copper sputter deposition, the substrate is removed from the sputtering chamber and a photoresist such as Dupont Riston 1215 photoresist is applied over the surface. The photoresist is then imaged utilizing a mercury vapor, ultraviolet lamp through a photographic negative mask. The imaged photoresist is then developed with trichloroethane so as to remove the unexposed portions of the photoresist. Copper is then electroplated to a thickness of about 1.5 mils over those areas from which the photoresist has been removed and in the through-holes. Thereafter, a solder etch-resist is electroplated over the same areas to a thickness of approximately 500 microinches. The remaining photoresist is then stripped with methylene chloride and the copper underlying the stripped photoresist is then removed by etching with a solution of ferric chloride or an ammoniacal cupric chloride solution and then rinsed thereby producing the final printed circuit board which is ready for the attachment of discrete devices thereon.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of making a printed circuit from a copper clad substrate having a plurality of spaced through-holes therein comprising:
   (a) mechanically scrubbing the surface of the copper cladding;
   (b) sputter etching the scrubbed surface so as to remove at least 50 A. of material therefrom;
   (c) vacuum metallizing the through-holes subsequent to sputter etching without breaking the vacuum created for sputter etching; and then
   (d) forming a circuit pattern on the substrate.

2. The method recited in claim 1 wherein mechanical scrubbing is accomplished by bristle brush or compressed wheel scrubbing or sanding.

3. The method recited in claim 2 using a 180–400 mesh abrasive.

4. The method recited in claims 1 or 2 wherein the step of vacuum metallization is accomplished by sputtering.

5. The method recited in claims 1 or 2 wherein vacuum metallization is by means of DC magnetron sputtering.

6. The method recited in claim 1 wherein the through-hole is metallized with copper.

7. The method recited in claim 6 wherein said copper layer is at least 4,000 A. thick.

8. The method recited in claim 1 wherein the time interval between steps (a) and (b) is no more than three days.

9. A method of making a printed circuit from a copper clad substrate having a plurality of spaced through-holes therein comprising:
   (a) mechanically scrubbing the surface of the copper cladding;
   (b) sputter etching the scrubbed surface so as to remove at least 50 A. of copper therefrom;
   (c) vacuum metallizing the through-holes without breaking the vacuum created for sputter etching;
   (d) applying photoresist over the copper surface;
   (e) exposing the photoresist to ultraviolet light through a mask so as to form a image therein;
   (f) developing the image to expose a copper circuit pattern;
   (g) electroplating copper over the exposed copper and through-holes;
   (h) forming a solder resist over the electroplated copper;
   (i) removing the remaining photoresist; and
   (j) etching away the copper which was under the photoresist removed in step (i).

* * * * *